(12) United States Patent
Amami et al.

(10) Patent No.: US 6,429,382 B1
(45) Date of Patent: Aug. 6, 2002

(54) ELECTRICAL MOUNTING STRUCTURE HAVING AN ELUTION PREVENTIVE FILM

(75) Inventors: Kazuyoshi Amami, Osaka; Hiroaki Takezawa, Nara; Tsukasa Shiraishi; Yoshihiro Bessho, both of Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/547,922

(22) Filed: Apr. 11, 2000

(30) Foreign Application Priority Data

Apr. 13, 1999 (JP) .......................................... 11-105223

(51) Int. Cl.7 ................................................ H05K 1/02
(52) U.S. Cl. ........................ 174/259; 174/260; 361/767; 361/771
(58) Field of Search ................................ 174/261, 257, 174/259, 260; 361/771, 767, 768, 808, 805

(56) References Cited

U.S. PATENT DOCUMENTS

| | | | |
|---|---|---|---|
| 5,313,365 A | * | 5/1994 | Pennisi et al. ............... 361/760 |
| 5,328,087 A | * | 7/1994 | Nelson et al. ............... 228/175 |
| 5,502,889 A | * | 4/1996 | Casson et al. ................. 29/830 |
| 5,672,400 A | * | 9/1997 | Hansen et al. .............. 428/40.1 |
| 5,879,794 A | * | 3/1999 | Korleski, Jr. ............. 428/317.1 |
| 5,958,590 A | * | 9/1999 | Kang et al. .................. 428/403 |
| 6,046,910 A | * | 3/2000 | Ghaem et al. ............... 361/760 |
| 6,064,120 A | * | 5/2000 | Cobbley et al. ............. 257/780 |
| 6,204,454 B1 | * | 3/2001 | Gotoh et al. ................. 174/255 |

FOREIGN PATENT DOCUMENTS

| | | |
|---|---|---|
| JP | 4-268381 | 9/1992 |
| JP | 5-242726 | 9/1993 |
| JP | 2543805 | 7/1996 |
| JP | 10-340625 | 12/1998 |

* cited by examiner

Primary Examiner—Kamand Curco
Assistant Examiner—Jose H. Allala
(74) Attorney, Agent, or Firm—McDermott, Will & Emery

(57) ABSTRACT

For the reliability in insulation and against sulfurization, the mounting structure of the invention includes an electric structure, and an electrically conductive adhesive layer including an electrically conductive filler disposed on the electric structure, and at least a portion of surface of the electrically conductive filler is exposed to an external environment, and an elution preventive film is disposed on at least a portion of the exposed surface. Further, an electrically conductive adhesive of this invention includes the electrically conductive filler, and an elution preventive film is disposed on the entire surface of the electrically conductive filler.

23 Claims, 4 Drawing Sheets

ELECTRICAL MOUNTING STRUCTURE HAVING AN ELUTION PREVENTIVE FILM

BACKGROUND OF THE INVENTION

1. Field of the Invention

The present invention relates to a mounting structure for mounting electronic components such as a semiconductor device, a method for producing the same, and an electrically conductive adhesive used for production of the mounting structure.

2. Description of the Related Art

Heretofore, in mounting a semiconductor device onto input/output terminal electrodes of a circuit board, one often utilizes the wire bonding method by soldering. In recent years, however, owing to scale reduction of a package of semiconductor devices and increased number of connection terminals, an interval between the connection terminals is becoming smaller, making it more and more difficult to perform the mounting with the use of a conventional soldering technique.

Therefore, in recent years, a method is proposed in which the semiconductor device such as an integrated circuit chip is directly mounted on the input/output terminali electrodes of the circuit board for scale reduction and effective utilization of a mounting area.

Above all, a flip-chip mounting method in which a semiconductor device is mounted facedown on a circuit board is regarded as being a useful method because a collective electrical connection can be established between the semiconductor device and the circuit board in addition to large mechanical strength after connection.

As a connecting material for the aforesaid flip-chip mounting method, a system using an electrically conductive adhesive is proposed or put into practical use.

This method is a promising method in view of both an improvement in reliability and a measure for environmental protection, due to the following two reasons.

Firstly, since the electrically conductive adhesive contains a resin material such as an epoxy resin, a soft connection is established against external force or thermal stress as compared with a solder, i.e. a metal material, thereby leading to an improvement in reliability.

Secondly, since the electrically conductive adhesive mainly contains particles of silver as an electrically conductive component, a clean mounting without the use of lead can be carried out.

On the other hand, for a conventional structure in which an electronic component such as a chip component or a package component is mounted onto a printed board, a structure is likewise proposed in which an electrically conductive adhesive is used in view of an improvement in reliability and a measure for environmental protection.

Thus, the mounting structure using an electrically conductive adhesive, will be a promising method in view of both an improvement in reliability and a measure for environmental protection in the future.

However, the mounting structure using an electrically conductive adhesive has the following two problems, thereby hindering the practical use thereof.

The first problem is a decrease in reliability of insulation caused by ion migration. The ion migration is a kind of electrolytic action, and is a phenomenon of insulation breakdown that occurs between electrodes through the following four steps when an electrolyte such as water is present between the electrodes to which a voltage is applied.

Step 1) Elution and ionization of positive electrode metal
Step 2) Migration of the ionized metal towards the negative electrode by application of a voltage
Step 3) Deposition of the metal ion migrated to the negative electrode
Step 4) Repetition of steps 1) to 3)

Through such an ion migration phenomenon, the metal grows like a dendrite between the electrodes and finally the electrodes are bridged with the metal to cause an insulation breakdown.

Silver used as a material of an electrically conductive filler of an electrically conductive adhesive has a tendency of being eluted, and is liable to cause ion migration. Further, in accordance with the further reduction in scale and weight of electronic apparatus in recent years, the pitch of electrodes disposed on a semiconductor device, an electronic component, or a circuit board is becoming further smaller, thereby all the more increasing the likelihood of ion migration. For this reason, it is essential to solve the problem of ion migration for practically carrying out the mounting with an electrically conductive adhesive.

Conventionally, for restraining the ion migration, the following three methods are proposed:

Proposal 1) Forming an electrically conductive filler with an alloy (silver-copper, silver-palladium, or the like),
Proposal 2) Sealing an electrically conductive adhesive with an insulating resin such as an epoxy resin,
Proposal 3) Capturing eluted metal ions and forming them into an insoluble substance by addition of an ion-capturing agent such as an ion-exchange resin or a chelating agent to an electrically conductive adhesive.

However, these proposals involve the following disadvantages. In the proposal 1, the filler metal will be extremely expensive, thereby increasing the costs for producing the electrically conductive adhesive. In the proposal 2, addition of the sealing step necessitates an increase in the number of steps and extensive installation of additional equipment, thereby raising the production costs. In the proposal 3, elution of metal ions from the electrically conductive filler decreases the contact property of the electrically conductive filler to raise the connection resistance.

Thus, though the aforementioned proposals produce an effect of restraining the ion migration, they involve other problems, so that it is difficult to put these proposals into practical use except for special fields. The second problem is a rise in the connection resistance by sulfurization. Sulfurization is a phenomenon in which a metal changes to a substance called metal sulfide having a lower electrical conductivity by reacting with a weakly acidic gas containing sulfur, such as hydrogen sulfide or sulfur dioxide. The sulfurization seems to occur through the following steps, though a lot of portions thereof still remain unresolved.

Step 1) Elution and ionization of a metal in a weakly acidic atmosphere
Step 2) Generation of metal sulfide by reaction of sulfur ions and metal ions As described previously, the electrically conductive filler is mainly composed of silver as a major component. However, since silver is extremely liable to be sulfurized, the volume resistivity of the electrically conductive adhesive increases when silver is sulfurized and, in accordance therewith, the connection resistance rises. Currently, few solutions to this problem have been reported, and it has been impossible to apply a mounting structure using an electrically conductive adhesive to a product of electronic components that may be possibly used in an environment, such as the neighborhood of a spa or a volcano, where hydrogen sulfide or sulfur dioxide is present at a relatively high concentration. For this reason, the field of applying the mounting structure using an electrically conductive adhesive has been extremely limited.

SUMMARY OF THE INVENTION

Thus, a principal object of the present invention is to maintain reliability of a mounting structure using an electrically conductive adhesive even under a comparatively severe condition such as a condition of much humidity or a gas atmosphere containing sulfur.

In order to achieve the aforesaid object, the present invention provides, in short, a mounting structure comprising an electric structure and an electrically conductive adhesive layer disposed on said electric structure, wherein said electrically conductive adhesive layer contains an electrically conductive filler, and an elution preventive film is disposed on at least a part of said electrically conductive filler. Owing to this construction, the mounting structure of the present invention exhibits a good insulation reliability even under a high temperature and high humidity environment. This is because the elution preventive film prevents elution of metal in the electrically conductive filler even under a high temperature and high humidity condition, thereby fundamentally preventing the ion migration reaction. Further, the mounting structure of the present invention does not cause sulfurization of an electrically conductive filler and shows a good connection reliability even if it is left to stand in a gas containing sulfur. This is because the sulfurization reaction can be fundamentally prevented by prevention of the elution of the electrically conductive filler. The elution preventive film used in the present invention may be made, for example, of a thermosetting resin, a thermoplastic resin, a metal alkoxide, or the like. Specific examples of the thermosetting resin include phenolic resin, urea resin, melamine resin, furan resin, unsaturated polyester resin, diallyl phthalate resin, epoxy resin, silicone resin, polyimide resin, and others. Specific examples of the thermoplastic resin include vinyl chloride resin, vinylidene chloride resin, polystyrene, AS resin, ABS resin, methacrylic resin, polyethylene, ionomer, methylpentene resin, polyallomer, fluororesin, polyamide, polyimide, polyamideimide, polyurethane, polycarbonate, polyester, polyacetal, denatured polyphenylene oxide, polysulfone, polyphenylene sulfide, and others. Specific examples of the metal alkoxide include silicon tetraethoxide, aluminum tributoxide, titanium tetrabutoxide, and others.

Here, if the mounting structure further comprises another electric structure disposed on said electric structure and said electrically conductive adhesive layer electrically connects said electric structure to said other electric structure, then the present invention will be especially effective, because the effect of ion migration reaction or sulfurization of the electrically conductive filler on the connection resistance will be considerable.

Specifically, it is sufficient if at least a part of said electrically conductive filler is exposed on a surface of said electrically conductive adhesive layer, and said elution preventive film is disposed at least on said exposed part of said electrically conductive filler. More specifically described, it is sufficient if said electrically conductive adhesive layer has numerous holes that are in communication with each other and with a surface of said electrically conductive adhesive layer; at least a part of said electrically conductive filler is exposed to an inner surface of said holes; and said elution preventive film is disposed at least on said electrically conductive filler that is exposed to said inner surface of said holes. This construction allows an elution preventive film to be selectively formed only on a portion of the electrically conductive filler which is in communication with the surface of the electrically conductive adhesive layer and which is liable to be eluted. This provides the following advantage.

If an elution preventive film is disposed on a portion of the filler that is involved in electrical connection, the elution preventive film in some cases causes an obstacle against electric conduction. Therefore, if the elution preventive film is present on this portion, a treatment such as pressing it along the conduction direction from outside is carried out to break the elution preventive film on this portion to ensure the electric conduction. In contrast, if the elution preventive film is selectively disposed only on a portion where the elution is liable to occur, there will be only a limited amount of the elution preventive film on a portion of the filler where the electric conduction must be established, thereby all the more improving the electric conduction.

Further, the elution preventive film is preferably water-insoluble, because then the elution preventive film will not elute even under a high temperature and high humidity condition, and the decrease in the elution preventing effect will be less liable to occur, whereby the effect of restraining the ion migration reaction and the effect of restraining the sulfurization of the electrically conductive filler can be maintained for a long period of time.

The water-insoluble elution preventive film that can be used in the present invention may be made, for example, of a thermosetting resin, a thermoplastic resin, a metal alkoxide, or the like. Specific examples of the thermosettin resin include phenolic resin, urea resin, melamine resin, furan resin, unsaturated polyester resin, diallyl phthalate resin, epoxy resin, silicone resin, polyimide resin, and others. Specific examples of the thermoplastic resin include vinyl chloride resin, vinylidene chloride resin, polystyrene, AS resin, ABS resin, methacrylic resin, polyethylene, ionomer, methylpentene resin, polyallomer, fluororesin, polyamide, polyimide, polyamideimide, polycarbonate, denatured polyphenylene oxide, polyphenylene sulfide, and others. Specific examples of the metal alkoxide include silicon tetraethoxide, aluminum tributoxide, titanium tetrabutbxide, and others.

The elution preventive film is preferably insoluble in an aqueous solution containing hydrogen sulfide or sulfur oxide, because then the effect of preventing the sulfurization reaction will be larger. This is due to the fact that, even if hydrogen sulfide or sulfur oxide is condensed as an aqueous solution on the surface of the elution preventive film, the elution preventive film does not elute, so that decrease in the elution preventive effect is unlikely to occur.

The elution preventive film insoluble in an aqueous solution containing hydrogen sulfide or sulfur oxide maybe made, for example, of a thermosetting resin, a thermoplastic resin, a metal alkoxide, or the like. Specific examples of the thermosetting resin include phenolic resin, melamine resin, furan resin, unsaturated polyester resin, diallyl phthalate resin, epoxy resin, silicone resin, polyimide resin, and others. Specific examples of the thermoplastic resin include vinyl chloride resin, vinylidene chloride resin, polystyrene, As resin, ABS resin, methacrylic resin, polyethylene, ionomer, methylpentene resin, polyallomer, fluororesin, polyamide, polyimide, polyamideimide, polycarbonate, denatured polyphenylene oxide, polyphenylene sulfide, and others. Specific examples of the metal alkoxide include silicon tetraethoxide, aluminum tributoxide, titanium tetrabutoxide, and others.

Here, the term "insolubility in an aqueous solution containing hydrogen sulfide or sulfur oxide or in water" is used to mean that it satisfies the following conditions. Namely, if the elution preventive film is formed of a resin, the aforesaid insolubility is defined as a property such that the amount of absorbed water or aqueous solution after 24 hours is less than or equal to 0.5 wt %. If the elution preventive film is formed of a complex, the aforesaid insolubility is defined as a property such that its solubility (weight of the complex dissolved in 100 g of water) is less than $1 \times 10^{-5}$ g.

The elution preventive film preferably contains a metal complex. The metal complex is a coordination compound produced by reaction of a metal with a complexing agent. This reaction proceeds rapidly at room temperature. Therefore, formation of a complex film on the surface of an electrically conductive filler is carried out by allowing the electrically conductive filler to contact with a complexing agent. The metal complex formed on the filler surface has an extremely strong coordination bond between the metal and the complexing agent, so that the metal complex is stable and has an excellent close contact with the metal. This, increases the elution preventing effect further, thereby producing a better effect of improvement in anti-ion-migration property and a better effect of improvement in anti-sulfurization-reaction property. Here, the ligand of the complexing agent for forming the metal complex may be, for example, aminoacetyl group, aminocarboxyl group, alkanolamine group, β-diketone group, β-ketoester group, polyamine group, imidazole group, or the like. Among these, use of aminocarboxyl group or imidazole group,bonded to a benzene ring is preferable because then the metal complex film will be insoluble in water and insoluble in an aqueous solution containing hydrogen sulfide or sulfur oxide, thereby further increasing the effect of restraining the ion migration and the effect of restraining the sulfurization reaction. Examples of such complexing agents include anthrahilic acid, 2-aminopiperidine, galloylgallic acid, potassium xanthate, oxine, quinaldinic acid, cupferron, 4-chloro-3-methyl-5-nitrobenzensulfonic acid, salicylaldoxime, diantipyrylmethane, diethyldithiocarbamic acid, p-dimethylaminobenzylidenerhodanine, dimethylglyoxime, oxalic acid, cinchonine, N-cynnamoyl-N-phenylhydroxylamine, thioacetamide, thionalide, thiourea, tetraphenylboric acid, trimethylphenylammonium, 1-nitroso-2-naphthol, nitron, neocupferron, bismuththiol II, p-hydroxyphenylarsonic acid, 8-hydroxy-7-iodo-5-quinolinesulfonic acid, pyrogallol, 1-pyrrolidinecarbodithioic acid, phenylarsonic acid, phenylthiodantoic acid, phenylfluorone, α-furildioxime, brucine, benzidine, N-benzoyl-N-phenylhydoxylamine, α-benzoinoxime, benzo[f]quinoline, 2-mercaptobenzothiazole, rhodamine B, and others.

Furthermore, the elution preventive film is not limited to a metal complex alone, and it may further contain a resin component. In short, it is sufficient if the elution preventive film has a function capable of preventing elution.

Here, if the electrically conductive filler contains silver, the effect of the present invention, that is, the effect of restraining the ion migration and the effect of restraining the sulfurization, will be conspicuous, because silver is a substance liable to cause ion migration an sulfurization reaction.

Examples of the aforesaid mounting structures to which the present invention can be applied include a circuit board having electronic components mounted thereon, a circuit board having a semiconductor device flip-chip mounted thereon, and others.

An adhesive of the present invention contains an electrically conductive filler, and at least a part of the electrically conductive filler has an elution preventive film. By this construction, a mounting structure mounted with the use of an electrically conductive adhesive of the present invention exhibits a good insulation reliability without causing ion migration even under a high temperature and high humidity environment. Further, it exhibits a good connection reliability without causing sulfurization of the electrically conductive filler even if it is left to stand in a gas containing sulfur.

Here, regarding the composition of the elution preventive film, it is preferably water-insoluble, it is preferably further insoluble in an aqueous solution containing hydrogen sulfide or sulfur oxide, it preferably contains a metal complex, and it preferably contains a resin component. Furthermore, the electrically conductive adhesive preferably contains silver.

Also, the present invention provides a method of producing a mounting structure, said method comprising the steps of forming an electrically conductive adhesive layer on an electric structure, said electrically conductive adhesive layer containing an electrically conductive filler; and forming an elution preventive film on said electrically conductive filler that is in communication with a surface of said electrically conductive adhesive layer after said electrically conductive adhesive layer is hardened. The mounting structure produced by this production method can exhibit an effect of improving the anti-ion-migration property and an effect of improving the anti-sulfurization-reaction property while maintaining the electric conduction of the electric structure well by forming the elution preventive film. Further, since the elution preventive film is formed on the electrically conductive filler after the electrically conductive adhesive layer is hardened, the elution preventive film does not enter an electric connection site of the electrically conductive adhesive layer to produce an adverse effect on the electric conduction state thereof, so that a good electric conduction can be ensured.

One method for forming an elution preventive film in this manner is a process of forming a complex. The process of forming a complex can perform the following function. The complexing process is carried out, for example, by pouring a complexing agent. Such a complexing process can be carried out with the use of an already-existing equipment, thereby eliminating the need for a new investment on equipment and inviting little increase in the production costs. Here, if a complex film is formed on a contact point between electrically conductive fillers or on a contact point between an electrically conductive filler and an electrode metal, it may possibly deteriorate the electric conductivity of the electrically conductive adhesive and the electric characteristics of the mounting structure to some extent, since complexes are generally insulating. In contrast, if the production method of the present invention is used, the electrically conductive filler is formed into a complex after the electrically conductive adhesive layer is hardened to ensure its electric conduction, so that only the site which is not involved in electric conduction can be formed into a complex while maintaining the aforesaid contact point between the electrically conductive fillers and the contact point between the electrically conductive filler and other electric structures electrically connected to the electrically conductive adhesive layer, as they are. Therefore, the elution preventive film can be effectively formed while ensuring the electric characteristics of the mounting structure, thereby giving a low connection resistance. Here, in this process, since the complexing agent reacts selectively to the metal portions, the elution preventive film is not formed on a site where the complexing process is not required, that is, the site of a resin component (binder resin or the like) of the electrically conductive adhesive layer or the surface of the electric structure (surface of the board or the like). Further according to the method of the present invention, since the complexing process is carried out after fabricating a mounting structure using an arbitrary electrically conductive adhesive, the present invention can be applied to a mounting structure that uses any kind of an electrically conductive adhesive, so that its economic effect is large.

Specific examples of mounting structures that can be produced by application of the present invention include a mounting structure in which another electric structure is electrically connected to said electric structure by said electrically conductive adhesive layer, a mounting structure in which an electronic component is mounted on a circuit board, and a mounting structure in which a semiconductor device is flip-chip mounted on a circuit board. In particular, if the present invention is applied to a mounting structure in which electronic components made of chip components such as a chip resistor are mounted on a circuit board, it can perform the following function.

If the aforementioned electronic components are mounted, their connection sites are exposed, so that an elution preventive film can be formed on the connection sites of all the components at the same time by a process such as a complexing process on the mounting structure after completion of the mounting structure. Therefore, the period of time required in forming an elution preventive film can be shortened. Here, if the elution preventive, film is formed by a complexing process, the complex film (elution preventive film) is not formed on a portion that need not be made into a complex, that is, the surface of the board, the surface of the components, or the like, because the complexing agent reacts selectively with a metal portion.

BRIEF DESCRIPTION OF THE DRAWINGS

The above and further objects of the invention will be apparent from the following detailed description of preferred embodiments and will be precisely indicated in the appended claims, and numerous other advantages which are not touched upon in the specification will be recalled to those skilled in the art in reducing the present invention into practice with reference to the accompanying drawings in which.

DETAILED DESCRIPTION OF THE INVENTION

Hereafter, preferable embodiments of the present invention will be described with reference to the attached drawings.

(First Embodiment)

Figure 1:
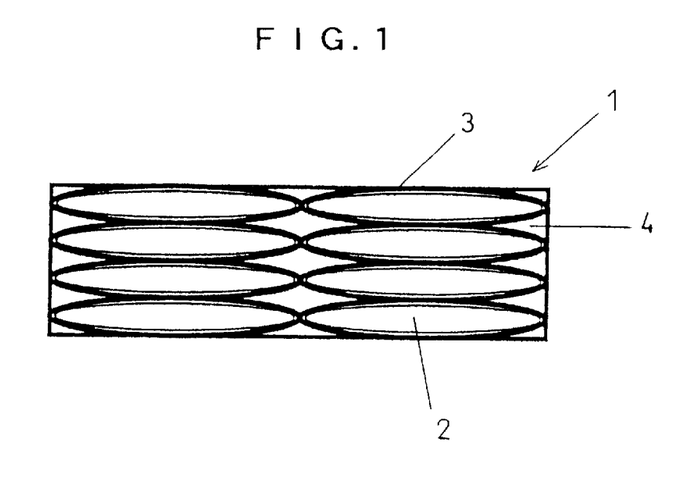
FIG. 1 is an enlarged view of an essential part of an electrically conductive adhesive according to the first preferable embodiment of the present invention.

In the first embodiment, the present invention is applied to an electrically conductive adhesive. FIG. 1 is an enlarged view of an essential portion of an electrically conductive adhesive 1 according to this embodiment. The electrically conductive adhesive 1 is characterized by the structure of the electrically conductive adhesive 1 itself. Namely, the electrically conductive adhesive 1 includes an electrically conductive filler 2 having an elution preventive film 3, and an organic binder 4, wherein the electrically conductive filler 2 and the organic binder 4 are mixed and dispersed.

The elution preventive film 3 can be made, for example, of a thermoplastic resin such as urethane resin, vinyl chloride resin, vinylidene chloride resin, polystyrene, or a thermosetting resin such as phenolic resin, urea resin, a melamine resin, or the like. The organic binder 4 may be made, for example, of an epoxy resin or of another resin such as vinyl acetate resin, acrylic resin, phenoxy resin, or the like. Further, the organic binder 4 may be made of a metal complex.

The electrically conductive filler 1 may be made, for example, of silver (Ag), gold (Au), Ag-coated Cu, Cu—Ag alloy, copper (Cu), nickel (Ni), Ag—Pd alloy, or the like. However, in view of the volume resistivity and the material costs, silver (Ag) is preferable.

(Second Embodiment)

Figure 2:
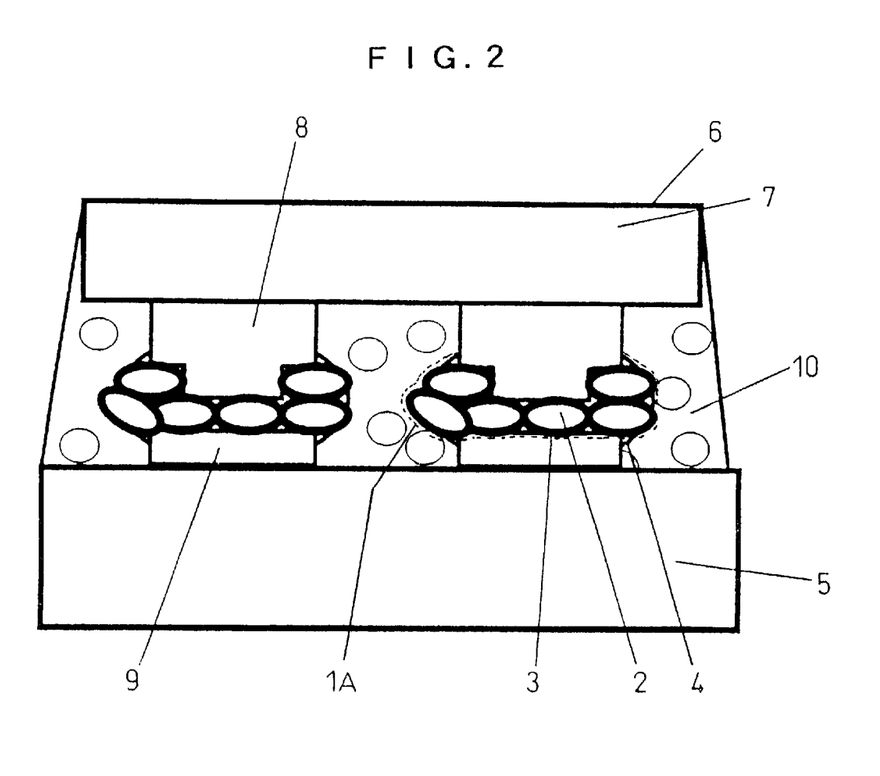
FIG. 2 is a cross-sectional view of a flip-chip mounting structure according to the second preferable embodiment of the present invention.

In this embodiment, the present invention is applied to a flip-chip mounting structure of a semiconductor device. Referring to FIG. 2, the mounting structure according to this embodiment includes a circuit board 5, which is an example of an electric structure, and a semiconductor device 6, which is an example of another electric structure. The semiconductor device 6 includes an IC board 7 and bump electrodes 8 disposed on a surface of the IC board 7. The circuit board 5 includes input/output terminal electrodes 9 disposed on a surface of the circuit board 5. Further, an electrically conductive adhesive layer 1A made of the electrically conductive adhesive 1 described in the first, embodiment is disposed on the input/output terminals 9, and an electric connection is established between the input/output terminals 9 and the bump electrodes 8 by the electrically conductive adhesive layer 1A. Furthermore, a sealing resin 10 is disposed in a gap between the semiconductor device 6 and the circuit board 5, thereby completing the flip-chip mounting structure.

(Third Embodiment)

Figure 3:
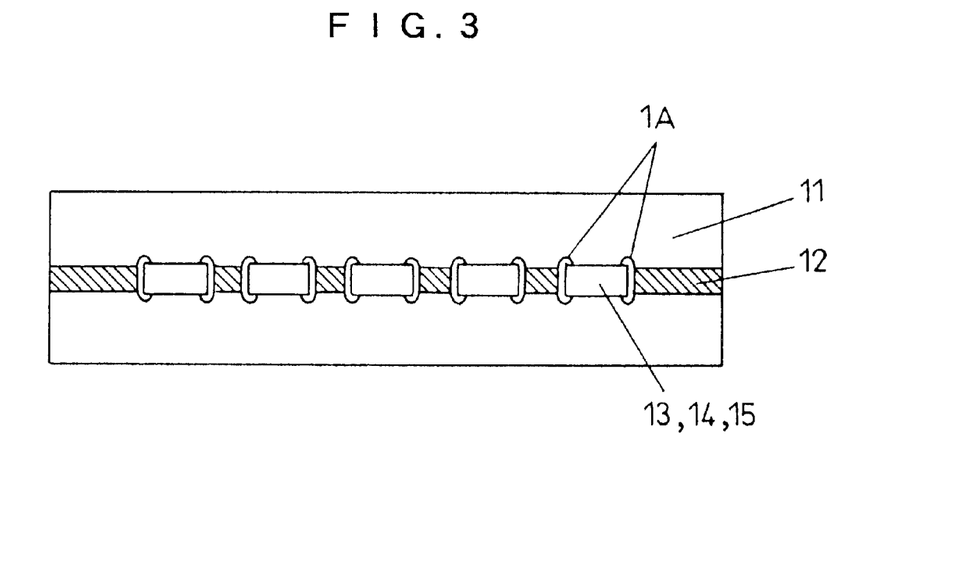
FIG. 3 is a plan view of a chip component mounting structure according to the third preferable embodiment of the present invention.

In this embodiment, the present invention is applied to a mounting structure of a chip component. Referring to FIG. 3, this mounting structure is constructed in such a manner that, on a surface of an electrode 12 of a circuit board 11 constituting an example of an electric structure, there are mounted a chip resistor 13, a chip coil 14, and a chip capacitor 15 constituting an example of another electric structure. Further, an electrically conductive adhesive layer 1A made of the electrically conductive adhesive 1 described in the first embodiment is disposed on the electrode 12, and an electric connection is established between the electrode 12 and the chip components 13, 14, 15 by the electrically conductive adhesive layer 1A.

(Fourth Embodiment)

Figure 4:
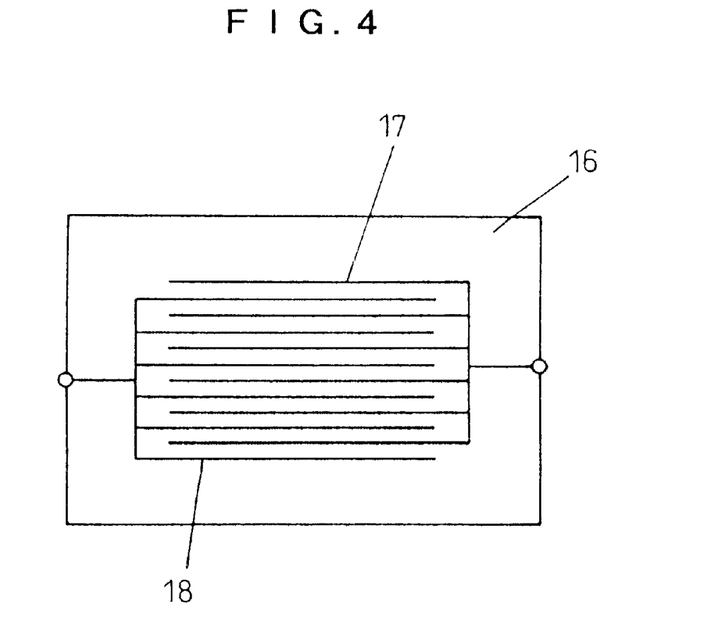
FIG. 4 is a plan view of a circuit board fabricated by a method according to the fourth preferable embodiment of the present invention.

The electrically conductive adhesive 1 and the mounting structures described in the aforesaid first to third embodiments are characterized in that the electrically conductive filler 2 contained in the electrically conductive adhesive 1 or in the electrically conductive adhesive layer 1A has an elution preventive film 3 in advance. In contrast, this embodiment is characterized in that an elution preventive film is formed on an electrically conductive filler contained in an electrically conductive adhesive layer after the electrically conductive adhesive layer is formed on an electric structure. In this embodiment, as an example thereof, the present invention is applied to an electric structure in which electrically conductive adhesive layers 17, 18 having a comb-like electrode shape are formed by the screen printing method on a circuit board 16, which is an example of an electric structure, as shown in FIG. 4. However, it goes without saying that the present invention can be likewise applied to an electrically conductive adhesive layer which is formed on a circuit board in mounting various electronic components, on the circuit board. Hereafter, the production method of this embodiment will be described.

First, on a circuit board 16, electrically conductive adhesive layers 17, 18 are formed with the use of an electrically conductive adhesive which is similar to conventional ones and which does not have an elution preventive film.

Next, a complexing solution is prepared by mixing a complexing agent into a solvent. Here, the blending ratio in the complexing solution and the type of the solvent may vary in accordance with the surface state of the electrically conductive filler 2 and the thickness of the elution preventive film 3 formed in a later process, so that their blending ratio and the type of the solvent are not particularly limited.

Then, the circuit board 16 is immersed into the complexing solution and pulled up therefrom, followed by a heat treatment. Through this process, the elution preventive film 3 made of a metal complex is formed on a surface of the electrically conductive filler 2 by evaporation of the solvent.

Figure 5A:
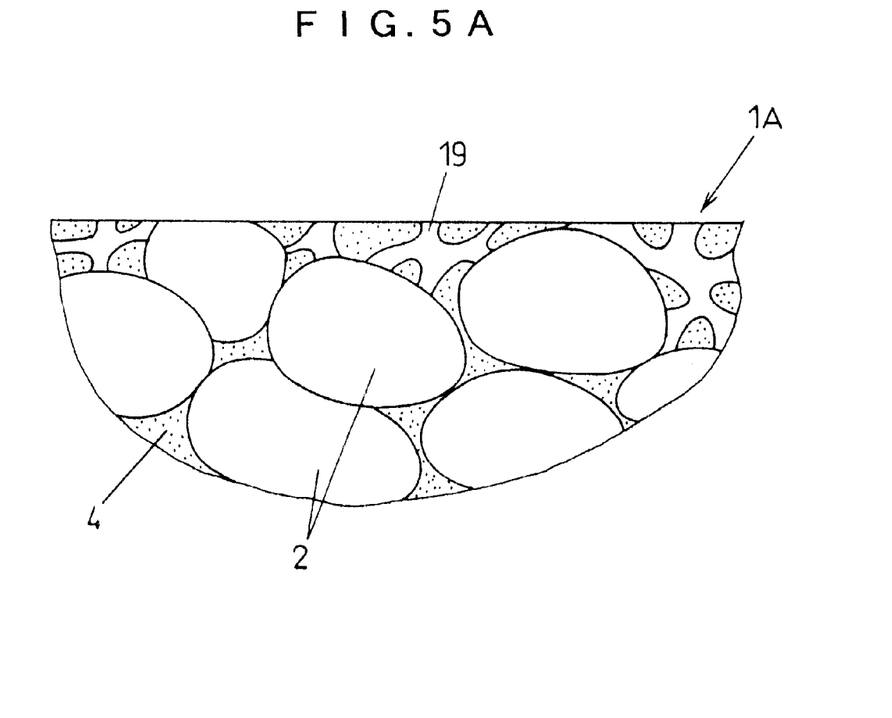
FIGS. 5(A) and 5(B) are each a cross-sectional view of an electrically conductive adhesive layer fabricated by the method according to the fourth embodiment.

Hereafter, the shape of the fabricated elution preventive film 3 will be described in detail with reference to FIG. 5. An electrically conductive adhesive 1 constituting the electrically conductive adhesive layers 17, 18 is composed of a mixture of an electrically conductive filler 2, an organic binder 4, and various additives. The electrically conductive adhesive layers 17, 18 are formed by heating and hardening the electrically conductive adhesive 1 thus constructed. During this process, most of the components (the organic binder and the like) other than the electrically conductive filler 2 are evaporated by heating. Therefore, numerous holes 19 are formed in the electrically conductive adhesive layers 17, 18 after the heating and hardening process by evaporation of these components (See FIG. 5(A)).

Most of these holes 19 are in communication with each other and also in communication with a surface of the electrically conductive filler 2. The electrically conductive filler 2 exposed to inner surfaces of these holes 19 are therefore exposed to an external environment. For this reason, the electrically conductive filler 2 is liable to be eluted from this site.

Figure 5B:
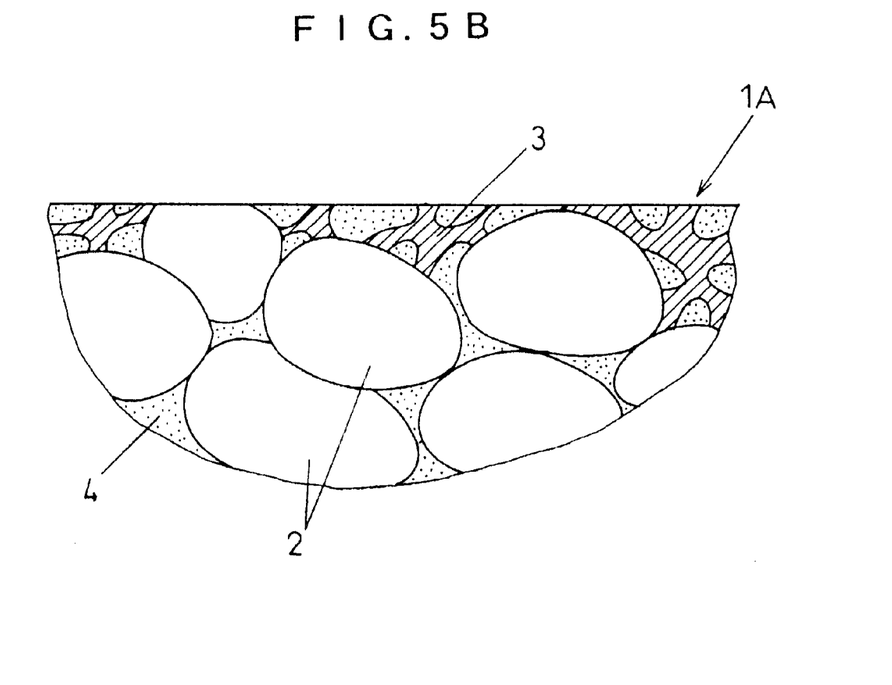

When the electrically conductive adhesive layers 17, 18 having such structural characteristics are immersed in a complexing solution, the complexing solution reaches to surface sites of the electrically conductive filler 2 exposed at a bottom of the holes 19 that are in communication with each other. Therefore, if an elution preventive film (metal complex film) 3 is formed by heating the complexing solution, the elution preventive film 3 is formed within the holes 19, whereby the surface sites of the electrically conductive filler 2 exposed at the bottom of the holes 19 are covered with the elution preventive film 3. Thus, the elution preventive film 3 can be selectively formed only on the surface sites of the electrically conductive filler 2 which are liable to be eluted, so that the elution preventive film 3 is not formed at a conduction site between the electrically conductive fillers 2 or at a place where electrical connection is to be established between the electrically conductive filler 2 and another electric structure.

Next, examples of the above-described embodiments will be explained.

First, each example of the first embodiment (the electrically conductive adhesive) will be described.

EXAMPLE 1

This Example is characterized in that the elution preventive film 3 of the electrically conductive adhesive 1 shown in the first embodiment is made of a urethane resin.

Next, a method of producing the electrically conductive adhesive 1 of this Example will be described. First, 0.5 wt % of urethane resin is dissolved in and mixed with 95.5 wt % of isopropyl alcohol to prepare an alcoholic solution of the resin. Here, the urethane resin has a water absorption of about 0.8% after 24 hours and has a property such that it easily absorbs water and an aqueous solution containing hydrogen sulfide or sulfur oxide. The blending ratio in the alcoholic resin solution to be prepared and the type of the solvent may vary in accordance with the surface state of the electrically conductive filler 2 and the thickness of the elution preventive film 3, to be formed, so that they are not particularly limited to the above-described conditions.

Then, an electrically conductive filler 2 made of silver (Ag) is put into the prepared alcoholic resin solution, followed by sufficient stirring. When the surface of the electrically conductive filler 2 is wetted by the alcoholic resin solution, the electrically conductive filler 2 is taken out from the alcoholic resin solution, followed by drying at about 30 minutes in a 100° C. oven to sufficiently evaporate isopropyl alcohol of the solvent. Through this process, an elution preventive film 3 made of the urethane resin is formed on the surface of the electrically conductive filler 2. The temperature and the period of time for this drying process may also vary in accordance with the resin concentration in the solution and the processed amount of the electrically conductive filler 2, so that they are not particularly limited to the above-described processing conditions.

An electrically conductive adhesive of this example is prepared by dispersing and mixing 92 wt % of the electrically conductive filler 2 on which the elution preventive film 3 is thus formed, 7 wt % of an organic binder 4 made of an epoxy resin having a thermosetting property, and 1 wt % of additives (dispersing agent, close contact property improving agent, and others).

EXAMPLE 2

This Example is characterized in that the elution preventive film 3 of the electrically conductive adhesive 1 described in Example 1 is made of urea resin instead of urethane resin. The urea resin has a water absorption of less than 0.5 wt %/24 h and is a resin defined as being insoluble in water and in an aqueous solution containing hydrogen sulfide or sulfuroxide in the present invention. The other conditions, that is, the constructing conditions of the electrically conductive adhesive materials, the production method, and the like are the same as in Example 1.

EXAMPLE 3

This Example is characterized in that the elution preventive film 3 of the electrically conductive adhesive 1 described in Example 1 is made of fluororesin instead of urethane resin. The fluororesin has a water absorption of less than 0.01 wt %/24 h and is a resin defined as being insoluble in water and in an aqueous solution containing hydrogen sulfide or sulfur oxide in the present invention. The other conditions, that is, the constructing conditions of the electrically conductive adhesive materials, the production method, and the like are the same as in Example 1.

EXAMPLE 4

This Example is characterized in that the elution preventive film 3 of the electrically conductive adhesive 1 described in Example 1 is made of a metal complex containing diethanolamine.

Next, a method of producing the electrically conductive adhesive 1. of this Example will be described. First, 10 wt % of diethanolamine constituting a complexing agent is dissolved in and mixed with 90 wt % of diisopropyl alcohol to prepare an alcoholic solution of the complexing agent. A metal complex produced by reaction of diethanolamine with a metal is an ionic substance which is extremely soluble in water and has a property such that it easily absorbs water and an aqueous solution containing hydrogen sulfide or sulfur oxide.

Here, the blending ratio in the complexing agent solution to be prepared and the type of the solvent may vary in accordance with the surface state of the electrically conductive filler 2 and the thickness of the elution preventive film 3 to be formed, so that they are not particularly limited to the above-described conditions.

Next, an electrically conductive filler 2 is put into the prepared complexing agent solution, followed by sufficient stirring. When the surface of the electrically conductive filler 2 is wetted by the complexing agent solution, the electrically conductive filler 2 is taken out from the complexing agent solution, followed by drying at about 30 minutes in a 100° C. oven to sufficiently evaporate isopropyl alcohol of the solvent. Through this process, diethanolamine and the electrically conductive filler 2 react on the surface of the electrically conductive filler 2, and an elution preventive film 3 made of this metal-complex is formed on the surface of the electrically conductive filler 2.

The temperature and the period of time for this drying process may also vary in accordance with the concentration of the complexing agent in the complexing agent solution and the processed amount of the electrically conductive filler 2, so that they are not particularly limited to the above-described processing conditions.

An electrically conductive adhesive of this example is prepared by dispersing and mixing 92 wt % of the electrically conductive filler 2 on which the elution preventive film 3 is thus formed, 7 wt % of an organic binder 4 made of an epoxy resin, and 1 wt % of additives (dispersing agent, close contact property improving agent, and others).

EXAMPLE 5

This Example is characterized in that the elution preventive film 3 of the electrically conductive adhesive 1 of Example 4 is made of a metal complex of o-aminobenzoic acid instead of a metal complex of diethanolamine.

A metal complex of diethanolamine is an ionic substance and is soluble in water and in an aqueous solution containing hydrogen sulfide or sulfur oxide. In contrast, a metal complex of o-aminobenzoic acid is non-ionic and is a metal complex defined as being insoluble in water and in an aqueous solution containing sulfur dioxide or hydrogen sulfide in the present invention.

Comparative Example 1

An electrically conductive adhesive of Comparative Example 1 was prepared in accordance with the aforementioned Examples 1 to 5.

This electrically conductive adhesive is constructed by dispersing and mixing 92 wt % of an electrically conductive filler. 2 made of silver, (Ag), 7wt % of an organic binder 4 made of epoxy resin, and 1 wt % of additives (dispersing agent, close contact property improving agent, and others).

An electrically conductive adhesive layer was formed by using the electrically conductive adhesive 1 of Examples 1 to 5 and Comparative Example 1 thus prepared, and evaluation and measurement were carried out according to the following methods.

(1) Evaluation of Anti-ion-migration Property (Water Drop Test)

The water drop test is a test method for evaluating the migration property of a material in a short period of time and in a simple manner. The details of the test method are as follows. As a test sample, a construction similar to the structure of the circuit board described in the fourth embodiment is adopted. Namely, referring to FIG. 4 again, electrically conductive adhesive layers 17, 18 having a comb-like electrode shape are formed on a circuit board 16 by the screen printing method. Here, a ceramic substrate is used as the circuit board 16. The electrically conductive adhesive layers 17, 18 are disposed to oppose each other in a state of being spaced apart with a predetermined distance (400 μm) between electrodes so that the tip ends of the electrodes are alternately arranged. At ordinary times, an electric current is not allowed to flow between the electrically conductive adhesive layers 17, Deionized water is dropped on the electrically conductive adhesive layers 17, 18 thus prepared, and a DC voltage (1V) is applied between the two electrically conductive adhesive layers 17, 18. A period of time till an electric current flows by a short circuit between the two electrically conductive adhesive layers, 17, 18, is measured to evaluate the anti-ion-migration property as the length of time till the short circuit.

Figure 6:
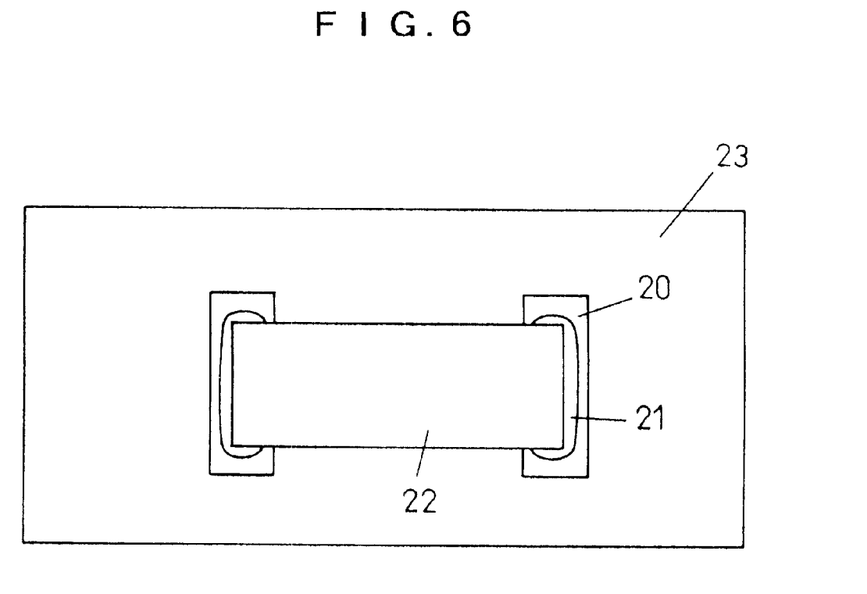
FIG. 6 is a plan view of a test sample used in evaluation of anti-sulfurization-reaction property.

Referring to FIG. 6, a gold-plated electrode 20 is formed on a circuit board 23 made of a glass epoxy resin, and further an electrically conductive adhesive layer 21 made of an electrically conductive adhesive 1 is formed on the gold-plated electrode 20 by the screen printing method. Further, a 0(zero) Ω resistor (terminal plating: SnPb solder) 22 having a 3216 size is mounted on the electrically conductive adhesive layer 21 by using a mounting apparatus. Then, the circuit board 23 is heated for 30 minutes in an oven of 150° C. to harden the electrically conductive adhesive layer 21. With respect to the sample thus prepared, an initial connection resistance is measured, and then the circuit board 23 is left to stand in a tightly closed tank filled with hydrogen sulfide, thereby to evaluate the anti-sulfurization-reaction property by measurement of the change in the connection resistance. The test was carried out under the conditions with a temperature of 400° C., a humidity of 90%, and a hydrogen sulfide concentration of 3 ppm, and the period of time for the test was 96 hours.

Table 1 shows the result of carrying out the above-described evaluation and measurement.

TABLE 1

|  | Elution preventive film | Migration test | Sulfurization test Initial | After 96 hrs. |
| --- | --- | --- | --- | --- |
| Example 1 | urethane resin | 550 sec | 38 mΩ | 56 mΩ |
| Example 2 | urea resin | 840 sec | 38 mΩ | 55 mΩ |
| Example 3 | fluororesin | 948 sec | 36 mΩ | 40 mΩ |

TABLE 1-continued

| | Elution preventive film | Migration test | Sulfurization test Initial | After 96 hrs. |
|---|---|---|---|---|
| Example 4 | diethanolamine Ag o-aminobenzoic | 1116 sec | 36 mΩ | 38 mΩ |
| Example 5 | acid Ag | 1232 sec | 36 mΩ | 36 mΩ |
| Example 16 | o-aminobenzoic acid Ag | 1229 sec | 30 mΩ | 30 mΩ |
| Comparative Example 1 | none | 86 sec | 30 mΩ | 98 mΩ |

With respect to the electrically conductive adhesives 1 of Examples 1 to 5, the following have been found out as compared with Comparative Example 1. Namely, in the evaluation of anti-ion-migration property, the period-of time till the electric current starts to flow is longer than that of Comparative example 1, thereby confirming an improvement in the-anti-ion-migration property. Also, in the evaluation of anti-sulfurization-reaction property, the change in the connection resistance before and after the test was smaller than that of Comparative Example 1, thereby confirming an improvement in the anti-sulfurization-reaction property.

Furthermore, the following has been confirmed by comparing the Examples. Namely, by comparison of the Examples 1 to 3 in which the elution preventive film 3 is formed of a resin with the Examples 4, 5 in which the elution preventive film 3 is formed of a metal complex, it has been confirmed that the Examples 4, 5 have a better anti-ion-migration property. This seems to be because the adhesion strength of the elution preventive film 3 to the electrically conductive filler 2 is increased by direct chemical reaction of the complex with the electrically conductive film 2 to form the elution preventive film 3 made of a metal complex.

Further, by comparison of the Examples, the following can be said both in the Examples 1 to 3 having an elution preventive film 3 made of a resin and in the Examples 4, 5 having an elution preventive film 3 made of a metal complex. Namely, the Examples 2, 3, 5 having an elution preventive film 3 formed of a material which is defined as being insoluble in water and in an aqueous solution containing hydrogen sulfide or sulfur oxide in the present invention, show improvements in the evaluation of anti-ion-migration property and in the evaluation of anti-sulfurization-reaction property as compared with the Examples 1, 4 having an elution preventive film 3 formed of a material other than that. Further, between the Examples 2, 3 having an elution preventive film 3 formed of a material which is defined as being insoluble by the aforesaid definition, the one having less solubility is found to give a higher evaluation result.

Next, Examples of the, second embodiment (a flip-chip mounting structure of a semiconductor device) will be described.

EXAMPLE 6

This Example is characterized in that a semiconductor device 6 is flip-chip mounted on a circuit board 5 with the use of the electrically conductive adhesive 1 of Example 1 in which the elution preventive film 3 is made of urethane resin (the only difference lying in that the organic binder is made of an epoxy resin having thermoplasticity).

Namely, the electrically conductive adhesive 1 described in Example 1 is transcribed onto bump electrodes 8 of a semiconductor device 6 by a known method. Then, in a state in which the transcribed electrically conductive adhesive 1 is aligned with input/output terminal electrodes 9 of the circuit board 5, the semiconductor device 6 is flip-chip mounted on the circuit board 5. Thereafter, an electrical test is carried out after the electrically conductive adhesive 1 is hardened. If good results are obtained, a sealing resin 10 made of an epoxy resin is supplied and hardened in a gap between the circuit board 5 and the semiconductor device 6 to seal the connection site, thereby completing the flip-chip mounting structure.

EXAMPLE 7

This Example is characterized in that a flip-chip mounting structure is constructed by using the electrically conductive adhesive 1 of Example 2 in which the elution preventive film 3 is made of urea resin. The construction and the fabrication method of the flip-chip mounting structure is the same as in Example 6 except for the electrically conductive adhesive 1.

EXAMPLE 8

This Example is characterized in that a flip-chip mounting structure is constructed by using the electrically conductive adhesive 1 of Example 3 in which the-elution preventive film 3 is made of a fluororesin. The construction and the fabrication method of the flip-chip mounting structure is the same as in Example 6 except for the electrically conductive adhesive 1.

EXAMPLE 9

This Example is characterized in that a flip-chip mounting structure is constructed by using the electrically conductive adhesive 1 of Example 4 in which the elution preventive film 3 is made of a metal complex containing diethanolamine. The construction and the fabrication method of the flip-chip mounting structure is the same as in Example 6 except for the electrically conductive adhesive 1.

EXAMPLE 10

This Example is characterized in that a flip-chip mounting structure is constructed by using the electrically conductive adhesive 1 of Example 5 in which the elution preventive film 3 is made of a metal complex containing o-aminobenzoic acid. The construction and the fabrication method of the flip-chip mounting structure is the same as in Example 6 except for the electrically conductive adhesive 1.

Comparative Example 2

A flip-chip mounting structure of Comparative Example 2 was fabricated in correspondence with the above-described Examples 6 to 10.

This flip-chip mounting structure was formed to have a mounting structure similar to those of Examples 6 to 10 with the use of the electrically conductive adhesive of Comparative Example 1.

A test on reliability was conducted on the flip-chip mounting structures of Examples 6 to 10 and Comparative Example 2 fabricated as described above, by the following method.

Namely, with respect to these flip-chip mounting structures, evaluation of the anti-ion-migration property was carried out by measuring the change in connection resistance under a high temperature and high humidity environment (85° C., 85%) while passing an electric current (10 mA) of the time of actual use. Similarly, evaluation of the antisulfurization-reaction property was carried out by measuring the change in connection resistance under a hydrogen sulfide atmosphere (40° C., 90%, hydrogen sulfide concentration of 3 ppm) while passing an electric current (10 mA) of the time of actual use. The results are shown in Table 2.

TABLE 2

|  | Elution preventive film | Migration test | Sulfurization test | |
|---|---|---|---|---|
|  |  |  | Initial | After 96 hrs. |
| Example 6 | urethane resin | 2240 h | 16 mΩ | 26 mΩ |
| Example 7 | urea resin | 3564 h | 16 mΩ | 25 mΩ |
| Example 8 | fluororesin | 4158 h | 15 mΩ | 21 mΩ |
| Example 9 | diethanolamine Ag | 5007 h | 16 mΩ | 19 mΩ |
| Example 10 | o-aminobenzoic acid Ag | 5878 h | 16 mΩ | 16 mΩ |
| Example 17 | o-aminobenzoic acid Ag | 5880 h | 12 mΩ | 12 mΩ |
| Comparative Example 2 | none | 647 h | 49 mΩ | 165 mΩ |

With respect to the flip-chip mounting structures of Examples 6 to 10, the following has been found out as compared with Comparative Example 2. Namely, the period of time till the electric current flows in the evaluation of anti-ion-migration property is longer than that of Comparative Example 2, thereby confirming an improvement in the anti-ion-migration property. Also, the change in connection resistance before and after the test in the evaluation of anti-sulfurization-reaction property is smaller than that of Comparative Example 2, thereby confirming an improvement in the anti-sulfurization-reaction property.

Furthermore, the following has been confirmed by comparing the Examples. Namely, by comparison of the Examples 6 to 8 in which the elution preventive film 3 is formed of a resin with the Examples 9, 10 in which the elution preventive film 3 is formed of a metal complex, it has been confirmed that the Examples 9, 10 have a better anti-ion-migration property.

Further, by comparison of the Examples, the following can be said both in the Examples 6 to 8 having an elution preventive film 3 made of a resin and in the Examples 9, 10 having an elution preventive film 3 made of a metal complex. Namely, the Examples 7, 8, 10 having an elution preventive film 3 formed of a material which is defined as being insoluble in water and in an aqueous solution containing hydrogen sulfide or sulfur oxide in the present invention, show improvements in the evaluation of anti-ion-migration property and in the evaluation of anti-sulfurization-reaction property as compared with the Examples 6, 9 having an elution preventive film 3 formed of a material other than that. Further, between the Examples 7, 8 having an elution preventive film 3 formed of a material which is defined as being insoluble by the aforesaid definition, the one having less solubility is found to give a higher evaluation result.

Thus, Examples 6 to 10 (flip-chip mounting structures) produce effects similar to those of Examples 1 to 5 (electrically conductive adhesives).

Here, in Examples 6 to 10, electrical connection was established between the semiconductor device 6 and the circuit board 5 with the use of an electrically conductive adhesive 1 having an organic binder 4 made of a thermoplastic epoxy resin. However, in the same manner as in the first embodiment, it goes without saying that similar effects are produced by using a thermosetting epoxy resin.

Further, in Examples 6 to 10, there is a fear that the elution preventive film 3 may possibly hinder the electric connection at each connection site (between the electrically conductive filler 2 and the bump electrodes 8, between the electric fillers 2, between the electrically conductive filler 2 and the input/output terminal electrodes 9). However, since the circuit board 5 and the semiconductor device 6 are press-bonded in performing the flip-chip mounting, the elution preventive film 3 at the pressed site (connection site) is broken by the press-bonding process to establish direct electrical connection at the connection site, so that the elution preventive film 3 does not hinder the connection.

Next, Examples of the third embodiment (chip component mounting structure) will be described.

EXAMPLE 11

This Example is directed to a chip component mounting structure fabricated by using the electrically conductive adhesive of Example 1. Here, in Example 1, an elution preventive film 3 made of urethane resin is used. This chip component mounting structure includes five chip resistors 13 (3216 size, SnPb-plated), two chip coils 14 (diameter of 8 mmφ, height of 4 mm), and four chip capacitors 15 (3216 size, SnPb-plated) mounted on an electrode 12, which has been formed by gold (Au) plating on a circuit board 11 (30 mm×60 mm, thickness of 1.6 mm) made of a glass epoxy substrate.

This chip component mounting structure was fabricated in the following manner. First, the electrically conductive adhesive 1 is screen-printed on the electrode 12 of the circuit board 11. Then, the chip components 13, 14, 15 are mounted on the electrode 12 with the use of an already-exiting component mounting apparatus, followed by heating at 150° C. for 30 minutes in an oven to harden the electrically conductive adhesive 1.

EXAMPLE 12

This Example is characterized in that a chip component mounting structure is constructed with the use of the electrically conductive adhesive 1 of Example 2. Here, in Example 2, the elution preventive film 3 is made of urea resin. The construction and the fabrication method of the chip component mounting structure are the same as in Example 11 except for the electrically conductive adhesive 1.

EXAMPLE 13

This Example is characterized in that a chip component mounting structure is constructed with the use of the electrically conductive adhesive 1 of Example 3. Here, in Example 3, the elution preventive film 3 is made of fluororesin. The construction and the fabrication method of the chip component mounting structure are the same as in Example 11 except for the electrically conductive adhesive 1.

EXAMPLE 14

This Example is characterized in that a chip component mounting structure is constructed with the use of the electrically conductive adhesive 1 of Example 4. Here, in Example 4, the elution preventive film 3 is made of a metal complex containing diethanolamine. The construction and the fabrication method of the chip component mounting structure are the same as in Example 11 except for the electrically conductive adhesive 1.

EXAMPLE 15

This Example is characterized in that a chip component mounting structure is constructed with the use of the electrically conductive adhesive 1 of Example 5. Here, in Example 5, the elution preventive film 3 is made of a metal complex containing o-aminobenzoic acid. The construction and the fabrication method of the chip component mounting structure are the same as in Example 11 except for the electrically conductive adhesive 1.

Comparative Example 3

A chip component mounting structure of Comparative Example 3 was fabricated in correspondence with the above-described Examples 11 to 15.

This chip component mounting structure was formed to have a mounting structure similar to those of Examples 11 to 15 with the use of the electrically conductive adhesive of Comparative Example 1.

A test on reliability was conducted on the chip component mounting structures of Examples 11 to 15 and on the chip component mounting structure of Comparative Example 3 fabricated as described above, by a method similar to the one used in Examples 6 to 10 and Comparative Example 2. The results are shown in Table 3.

TABLE 3

|  | Elution preventive film | Migration test | Sulfurization test | |
|---|---|---|---|---|
|  |  |  | Initial | After 96 hrs. |
| Example 11 | urethane resin | 2040 h | 24 mΩ | 40 mΩ |
| Example 12 | urea resin | 3099 h | 25 mΩ | 39 mΩ |
| Example 13 | fluororesin | 4011 h | 24 mΩ | 29 mΩ |
| Example 14 | diethanolamine Ag | 4996 h | 23 mΩ | 26 mΩ |
| Example 15 | o-aminobenzoic acid Ag | 5463 h | 24 mΩ | 24 mΩ |
| Example 18 | o-aminobenzoic acid Ag | 5475 h | 21 mΩ | 21 mΩ |
| Comparative Example 3 | none | 650 h | 21 mΩ | 102 mΩ |

With respect to the chip component mounting structures of Examples 10 to 15, the following has been found out as compared with Comparative Example 3. Namely, the period of time till the electric current flows in the evaluation of anti-ion-migration property is longer than that of Comparative Example 3, thereby confirming an improvement in the anti-ion-migration property. Also, the change in connection resistance before and after the test in the evaluation of anti-sulfurization-reaction property is smaller than that of Comparative Example 3, thereby confirming an improvement in the anti-sulfurization-reaction property.

Furthermore, the following has been confirmed by comparing the Examples. Namely, by comparison of the Examples 11 to 13 in which the elution preventive film 3 is formed of a resin with the Examples 14, 15 in which the elution preventive film, 3 is formed of a metal complex, it has been confirmed that the Examples 14, 15 have a better anti-ion-migration property.

Further, by comparison of the Examples, the following can be said both in the Examples 11 to 13 having an elution preventive film 3 made of a resin and in the Examples 14, 15 having an elution preventive film 3 made of a metal complex. Namely, the Examples 12, 13, 15 having an elution preventive film 3 formed of a material which is defined as being insoluble in water and in an aqueous solution containing hydrogen sulfide or sulfur oxide in the present invention, show improvements in the evaluation of anti-ion-migration property and in the evaluation of anti-sulfurization-reaction property as compared with the Examples 11, 14 having an elution preventive film 3 formed of a material other than that. Further, between the Examples 12, 13 having an elution preventive film 3 formed of a material which is defined as being insoluble by the aforesaid definition, the one having less solubility is found to give a higher evaluation result.

Thus, Examples 11 to 15 (chip component mounting structures) produce effects similar to those of Examples 1 to 5 (electrically conductive adhesives) and those of Examples 6 to 10 (flip-chip mounting structures).

Hereafter, Examples of the fourth embodiment of the present invention will be described.

EXAMPLE 16

A circuit board 6 (See FIG. 4) is prepared which has a structure similar to the one prepared for evaluation and measurement of Examples 1 to 5. Then, on this circuit board 6, electrically conductive adhesive layers 17, 18 are formed with the use of the electrically conductive adhesive of Comparative Example 1 (conventional example). The fabrication method of the electrically conductive adhesive layers 17, 18 is similar to the one for the test samples of Examples 1 to 5 and Comparative Example 1.

Further, a complexing agent solution is prepared by mixing 10 wt % of o-aminobenzoic acid with 90 wt % of isopropyl alcohol. Here, the blending ratio in the complexing agent solution and the type of the solvent may vary in accordance with the surface state of the electrically conductive filler 2 and the thickness of the elution preventive film 3 formed in a later process, so that their blending ratio and the type of the solvent are not particularly limited as such.

The above-described circuit board 16 is immersed in the complexing agent solution for 30 seconds and pulled up therefrom, followed by drying at 100° C. for 30 minutes to form an elution preventive film 3 made of a metal complex on the electrically conductive filler 2 contained in the electrically conductive adhesive layers 17, 18 and to evaporate isopropyl alcohol. This completes the test sample shown in FIG. 4.

The test sample thus prepared has a structure similar to the test samples prepared in Examples 1 to 5 which are the Examples of the first embodiment. Thus, for comparison between this Example and Examples 1 to 5, evaluation test was carried out according to a test method similar to that of Examples 1 to 5. The results are shown together in the aforesaid Table 1.

As a result, it has been confirmed that, in the evaluation of anti-ion-migration property, the mounting structure prepared according to the production method of this Example has properties similar to those of Examples 1 to 5 in which the elution preventive film 3 is formed in advance on the electrically conductive filler 2. Also, in the evaluation of anti-sulfurization-reaction property, it ha s been confirmed that there is no rise in the connection resistance at all and further that the absolute value of the connection resistance value is lower than the maximum value of Examples 1 to 5.

EXAMPLE 17

A flip-chip mounting structure is prepared which has a construction similar to that of Comparative Example 2. However, at this stage, the gap between the semiconductor device 6 and the circuit boar, is not sealed with a sealing resin 10. In this state, a complexing agent similar to the one used in Example 1 is injected into the gap between the semiconductor device 6 and the circuit board 5 by means of an injector, followed by drying at 100° C. for 30 minutes to form an elution preventive film 3 made of a metal complex on the surface of the electrically conductive filler 2 and to evaporate the solvent.

Thereafter, the sealing resin 10 is injected into the gap between the semiconductor device 6 and the circuit board 5, thereby to complete a test sample of the flip-chip mounting structure.

The test sample thus prepared has a structure similar to the test samples prepared in Examples 6 to 10 which are the Examples of the second embodiment. Thus, for comparison between this Example and Examples 6 to 10, evaluation test was carried out according to a test method similar to that of Examples 6 to 10. The results are shown together in the aforesaid Table 2.

As a result, it has been confirmed that, in the evaluation of anti-ion-migration property, the flip-chip mounting structure prepared according to the production method of this Example has properties similar to those of Examples 6 to 10 in which the elution preventive film 3 is formed in advance on the electrically conductive filler 2. Also, in the evaluation of anti-sulfurization-reaction property, it has been confirmed that there is no rise in the connection resistance at all and further that the absolute value of the connection resistance value is lower than the maximum value of Examples 6 to 10.

EXAMPLE 18

A chip component mounting structure is prepared which has a construction similar to that of Comparative Example 3. Then, the chip component mounting structure is immersed in a complexing agent solution, which is similar to the complexing agent solution used in Example 16, for 30 seconds and pulled up therefrom, followed by drying at 100° C. for 30 minutes to form an elution preventive film 3 made of a metal complex on the electrically conductive filler 2 contained in the electrically conductive adhesive layer 21 and to evaporate isopropyl alcohol. This completes the test sample shown in FIG. 6.

The test sample thus prepared has a structure similar to the test samples prepared in Examples 11 to 15 which are the Examples of the third embodiment. Thus, for comparison between this Example and Examples 11 to 15, evaluation test was carried out according to a test method similar to that of Examples 11 to 15. The results are shown together in the aforesaid Table 3.

As a result, it has been confirmed that, in the evaluation of anti-ion-migration property, the chip component mounting structure prepared according to the production method of this Example has properties similar to those of Examples 11 to 15 in which the elution preventive film 3 is formed in advance on the electrically conductive filler 2. Also, in the evaluation of anti-sulfurization-reaction property, it has been confirmed that there is no rise in the connection resistance at all and further that the absolute value of the connection resistance value is lower than the maximum value of Examples 11 to 15.

As described and shown above, the present invention produces a mounting structure having a superior anti-ion-migration property or a superior anti-sulfurization-reaction property to the conventional ones. Further, if the present invention is applied to a mounting structure such as a flip-chip mounting structure or a chip component mounting structure, insulation reliability is improved, thereby making it possible to reduce the connection interval between electrodes or the like and to save the space of the mounting structure. Furthermore, since the present invention improves the reliability against sulfurization reaction, the present invention can be applied to a product that may possibly be used in a gas atmosphere containing a large amount of sulfur, such as the neighborhood of a spa or the vicinity of a volcano, whereby it can be fully expected that the range of its use will be enlarged to a great extent.

While this invention has been described with reference to the most preferable embodiments thereof, various changes and modifications can be made to the combinations and arrangements of components for preferable embodiments without departing from the spirit and scope of this invention as defined by the appended claims.

What is claimed is:

1. A mounting structure comprising:
   an electric structure, and
   an electrically conductive adhesive layer comprising an electrically conductive filler disposed on said electric structure,
   wherein at least a portion of the surface of said electrically conductive filler is exposed to an external environment, and an elution preventive film is disposed on only said exposed surface at least on a portion thereof.

2. The mounting structure according to claim 1, further comprising another electric structure disposed on said electric structure, said electrically conductive adhesive layer establishing electric connection between said electric structure and said other electric structure.

3. The mounting structure according to claim 1, wherein said electrically conductive adhesive layer has numerous holes that are in communication with each other and also in communication with a surface of said electrically conductive adhesive layer; at least a part of said electrically conductive filler is exposed to an inner surface of said holes; and said elution preventive film is disposed at least on said electrically conductive filler that is exposed to said inner surface of said holes.

4. The mounting structure according to claim 1, wherein said elution preventive film comprises a water-insoluble substance.

5. The mounting structure according to claim 1, wherein said elution preventive film comprises a substance insoluble in an aqueous solution containing hydrogen sulfide or sulfur oxide.

6. The mounting structure according to claim 1, wherein said elution preventive film contains a metal complex.

7. The mounting structure according to claim 1, wherein said elution preventive film contains a resin component.

8. The mounting structure according to claim 1, wherein said electrically conductive filler contains silver.

9. The mounting structure according to claim 2, wherein said electric structure is a circuit board, and said other electric structure is an electronic component mounted on said circuit board.

10. The mounting structure according to claim 9, wherein said other electric structure is a semiconductor device which is flip-chip mounted onto said electric structure made of said circuit board.

11. An electrically conductive adhesive comprising:
    an electrically conductive filler, and
    an elution preventive film comprising a resin component, wherein said elution preventive film is disposed on the entire surface of the electrically conductive filler.

12. The electrically conductive adhesive according to claim 11, wherein said elution preventive film comprises a water-insoluble substance.

13. The electrically conductive adhesive according to claim 11, wherein said elution preventive film comprises a substance insoluble in an aqueous solution containing hydrogen sulfide or sulfur oxide.

14. The electrically conductive adhesive according to claim 11, wherein said elution preventive film is selected from the group consisting of thermosetting resin and thermoplastic resin.

15. The electrically conductive adhesive according to claim 11, wherein said electrically conductive filler contains silver.

16. The mounting structure according to claim 1, wherein the elution preventive film is disposed on all portions of said exposed surface.

17. The mounting structure according to claim 1, wherein the elution preventive film is disposed on substantially all of said exposed surface.

18. The mounting structure according to claim 1, wherein no portion of the surface of said electrically conductive filler is exposed to the external environment after deposition of said elution preventive film.

19. The mounting structure according to claim 1, wherein the external environment is the atmosphere.

20. The mounting structure according to claim 1, wherein the elution preventive film is non-conductive.

21. The mounting structure according to claim 1, wherein said electrically conductive filler comprises a plurality of particles, and at least one of said particles of the electrically conductive filler is exposed to the external environment.

22. A mounting structure, comprising:

an electric structure; and an electrically conductive adhesive layer disposed on said electric structure, said electrically conductive adhesive layer including an electrically conductive filler, wherein said electrically conductive adhesive layer includes at least one hole formed therein extending to a surface of said electrically conductive adhesive layer, at least a part of the electrically conductive filler being exposed to said at least one hole, wherein an elution preventive film is disposed on at least a portion of said exposed part.

23. The mounting structure according to claim 22, wherein said elution preventive film comprises a substance insoluble in an aqueous solution containing hydrogen sulfide or sulfur oxide.

* * * * *